(12) United States Patent
Nakajima et al.

(10) Patent No.: US 9,269,447 B1
(45) Date of Patent: Feb. 23, 2016

(54) NONVOLATILE SEMICONDUCTOR MEMORY DEVICE

(71) Applicant: KABUSHIKI KAISHA TOSHIBA, Minato-ku (JP)

(72) Inventors: Yasushi Nakajima, Kawasaki (JP); Yuki Yamamura, Yokohama (JP); Yuki Kanamori, Kamakura (JP); Kenri Nakai, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/559,436

(22) Filed: Dec. 3, 2014

Related U.S. Application Data

(60) Provisional application No. 62/046,421, filed on Sep. 5, 2014.

(51) Int. Cl.
| | | |
|---|---|---|
| *G11C 16/10* | (2006.01) | |
| *G11C 16/16* | (2006.01) | |
| *G11C 16/26* | (2006.01) | |
| *G11C 11/56* | (2006.01) | |

(52) U.S. Cl.
CPC ............ *G11C 16/16* (2013.01); *G11C 11/5635* (2013.01); *G11C 11/5642* (2013.01); *G11C 16/26* (2013.01)

(58) Field of Classification Search
CPC ........................................................ G11C 16/10

USPC ................................................... 365/185.11
See application file for complete search history.

(56) References Cited

U.S. PATENT DOCUMENTS

| | | | |
|---|---|---|---|
| 7,586,785 B2 * | 9/2009 | Hosono .................. | G11C 16/10 365/185.12 |
| 7,590,007 B2 | 9/2009 | Futatsuyama | |
| 7,697,334 B2 | 4/2010 | Nakajima et al. | |

FOREIGN PATENT DOCUMENTS

| | | |
|---|---|---|
| JP | 2006-114078 | 4/2006 |
| JP | 2009-37720 | 2/2009 |
| JP | 4997882 | 8/2012 |

* cited by examiner

*Primary Examiner* — Son Mai
(74) *Attorney, Agent, or Firm* — Oblon, McClelland, Maier & Neustadt, L.L.P.

(57) ABSTRACT

A nonvolatile semiconductor memory device according to an embodiment comprises a control unit, in a data write, determining at least one of: a first requirement that the number of times of a data read on first through n1-th pages (where n1 is an integer of 1 to N−1) of a target block executed after the most recent data erase on the target block, is less than a reference number of times; and a second requirement that the number of memory cells whose threshold voltage is higher than a reference voltage, of a plurality of memory cells of a reference page of n1+1-th through N-th pages of the target block, is less than a reference number, and when the determined requirement is satisfied, writing additional data to the n1+1-th through N-th pages of the target block.

20 Claims, 11 Drawing Sheets

| Page | Write Sequence | | |
|---|---|---|---|
| | Fine | Foggy | 1st |
| 0 | 5 | 2 | 0 |
| 1 | 8 | 4 | 1 |
| 2 | 11 | 7 | 3 |
| 3 | 14 | 10 | 6 |
| 4 | 17 | 13 | 9 |
| 5 | 20 | 16 | 12 |
| ... | ... | ... | ... |
| 80 | 245 | 241 | 237 |
| 81 | 248 | 244 | 240 |
| 82 | 251 | 247 | 243 |
| 83 | 254 | 250 | 246 |
| 84 | 256 | 253 | 249 |
| 85 | 257 | 255 | 252 |

NONVOLATILE SEMICONDUCTOR MEMORY DEVICE

CROSS-REFERENCE TO RELATED APPLICATIONS

This application is based upon and claims the benefit of priority from the prior U.S. Provisional Application 62/046,421, filed on Sep. 5, 2014, the entire contents of which are incorporated herein by reference.

BACKGROUND

1. Field

Embodiments relate to a nonvolatile semiconductor memory device.

2. Description of the Related Art

In the case of a NAND type nonvolatile semiconductor memory device, sometimes, when performing data read on a selected page, a threshold voltage of a memory cell of another page of a block to which the selected page belongs ends up varying due to the influence of a read voltage applied to a word line at this time.

DETAILED DESCRIPTION

A nonvolatile semiconductor memory device according to an embodiment comprises: a cell array including a source line, a plurality of bit lines, a plurality of word lines intersecting the plurality of bit lines, and a plurality of cell strings electrically connected between the source line and the plurality of bit lines, each of the cell strings being configured from a plurality of memory cells connected in series to each be connected to one of the word lines; and a control unit that performs a data write/erase/read on the memory cells, the cell array being divided into a plurality of blocks including a target block, each of the blocks including first through N-th pages (where N is an integer of 2 or more), each of the pages being configured by a plurality of the memory cells connected to one of the word lines, the control unit executing the data write/read in a unit of the page, and executing the data erase in a unit of the block, and the control unit, in the data write, determining at least one of: a first requirement that the number of times of the data read on first through n1-th pages (where n1 is an integer of 1 to N−1) of the target block executed after the most recent data erase on the target block, is less than a reference number of times; and a second requirement that the number of memory cells whose threshold voltage is higher than a reference voltage, of the plurality of memory cells of a reference page of n1+1-th through N-th pages of the target block, is less than a reference number, and when the determined requirement is satisfied, writing additional data to the n1+1-th through N-th pages of the target block.

Nonvolatile semiconductor memory devices according to embodiments will be described below with reference to the drawings.

First Embodiment

First, an overall configuration of a nonvolatile semiconductor memory device according to a first embodiment will be described.

Figure 1:
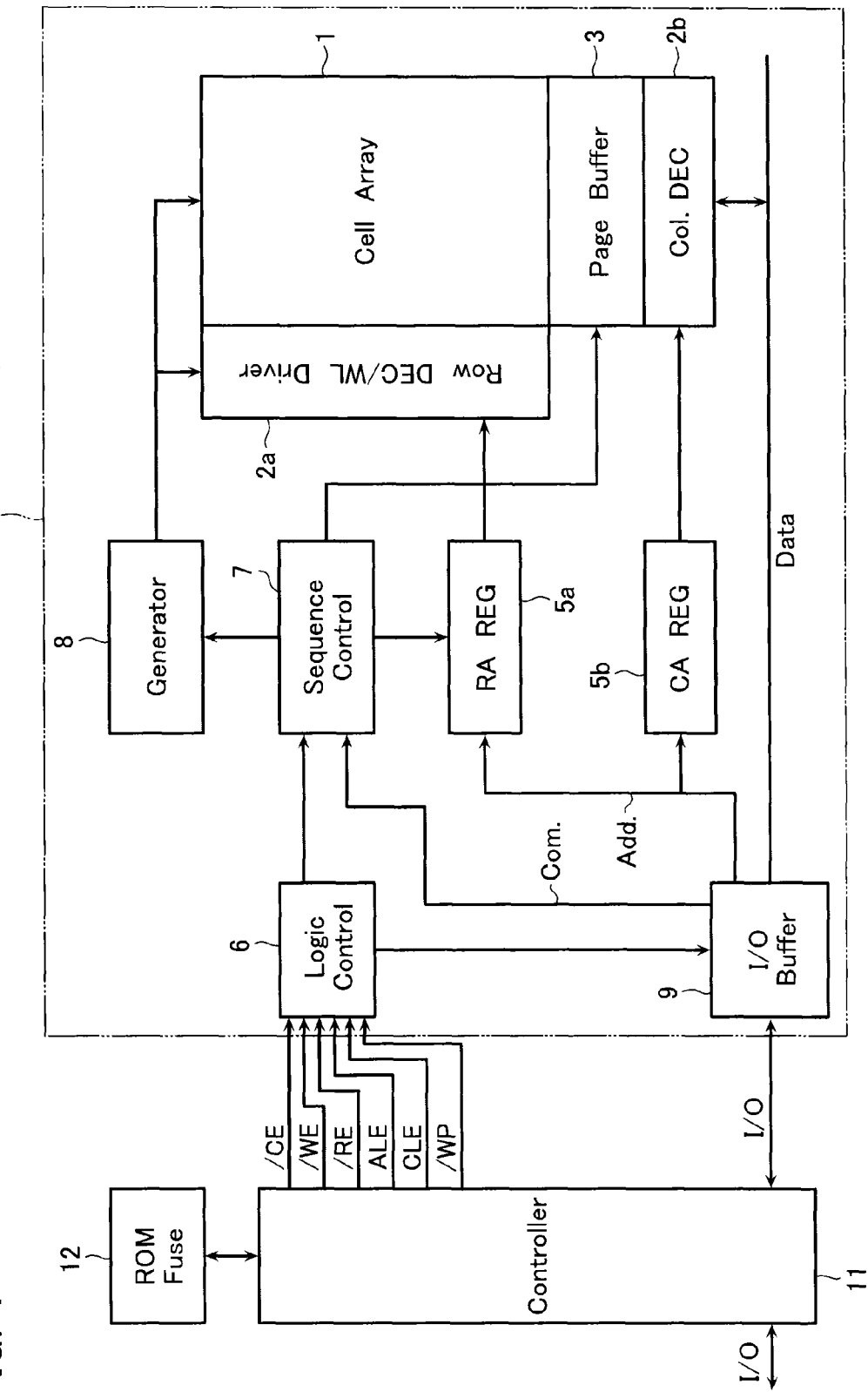
FIG. 1 is a functional block diagram of a nonvolatile semiconductor memory device according to a first embodiment.

FIG. 1 is a functional block diagram of the nonvolatile semiconductor memory device according to the present embodiment.

This nonvolatile semiconductor memory device is a NAND type flash memory and comprises: a NAND chip 10; a controller 11 that controls this NAND chip 10; and a ROM fuse 12 that stores various kinds of information required for access to the NAND chip 10.

The NAND chip 10 comprises a cell array 1. The cell array 1 includes a plurality of bit lines extending in a column direction, a plurality of word lines and a source line extending in a row direction, and a plurality of memory cells selected by the bit line and the word line. A group of memory cells selected by one word line configures a page. A data write/read of the flash memory is performed in a unit of the page. The cell array 1 will be described later.

In addition, the NAND chip 10 comprises a control unit that executes: a write sequence which is a series of processes for writing data to the memory cell; an erase sequence which is a series of processes for erasing data of the memory cell; and a read sequence which is a sequence of processes for reading data from the memory cell. The control unit includes: a row decoder/word line driver 2a; a column decoder 2b; a page buffer 3; a row address register 5a and column address register 5b; a logic control circuit 6; a sequence control circuit 7; a voltage generating circuit 8; and an I/O buffer 9.

The row decoder/word line driver 2a drives the word line and a later-to-be-described select gate line of the cell array 1.

The page buffer 3 includes a one page portion of sense amplifier circuits and latch circuits. A one page portion of read data stored by the page buffer 3 is sequentially column selected by the column decoder 2b to be outputted to an external I/O terminal via the I/O buffer 9. Write data supplied from the I/O terminal is selected by the column decoder 2b to be loaded into the page buffer 3. The page buffer 3 is loaded with a one page portion of write data. Row and column address signals are inputted via the I/O buffer 9 and transferred to the row decoder 2a and column decoder 2b, respectively. The row address register 5a stores an erase block address in the case of a data erase, and stores a page address in the case of the data write/read. The column address register 5b is inputted with a leading column address for loading write data before start of the write sequence, or a leading column address for the read sequence. The column address register 5b stores the inputted column address until a write enable signal /WE or a read enable signal /RE is toggled by a certain condition.

The logic control circuit 6 controls input of a command or an address, and input/output of data, based on control signals such as a chip enable signal /CE, a command latch enable signal CLE, an address latch enable signal ALE, the write enable signal /WE, the read enable signal /RE, and a write protect signal /WP. The sequence control circuit 7 receives a command from the logic control circuit 6 and controls the write sequence, the erase sequence, and the read sequence based on this command. The voltage generating circuit 8 is controlled by the sequence control circuit 7 to generate certain voltages required for various operations.

The controller 11 controls the read sequence and the write sequence by conditions appropriate to a current write state of the NAND chip 10. Note that part of the read sequence and the write sequence may also be controlled by the control unit of the NAND chip 10.

Next, the cell array 1 will be described.

Figure 2:
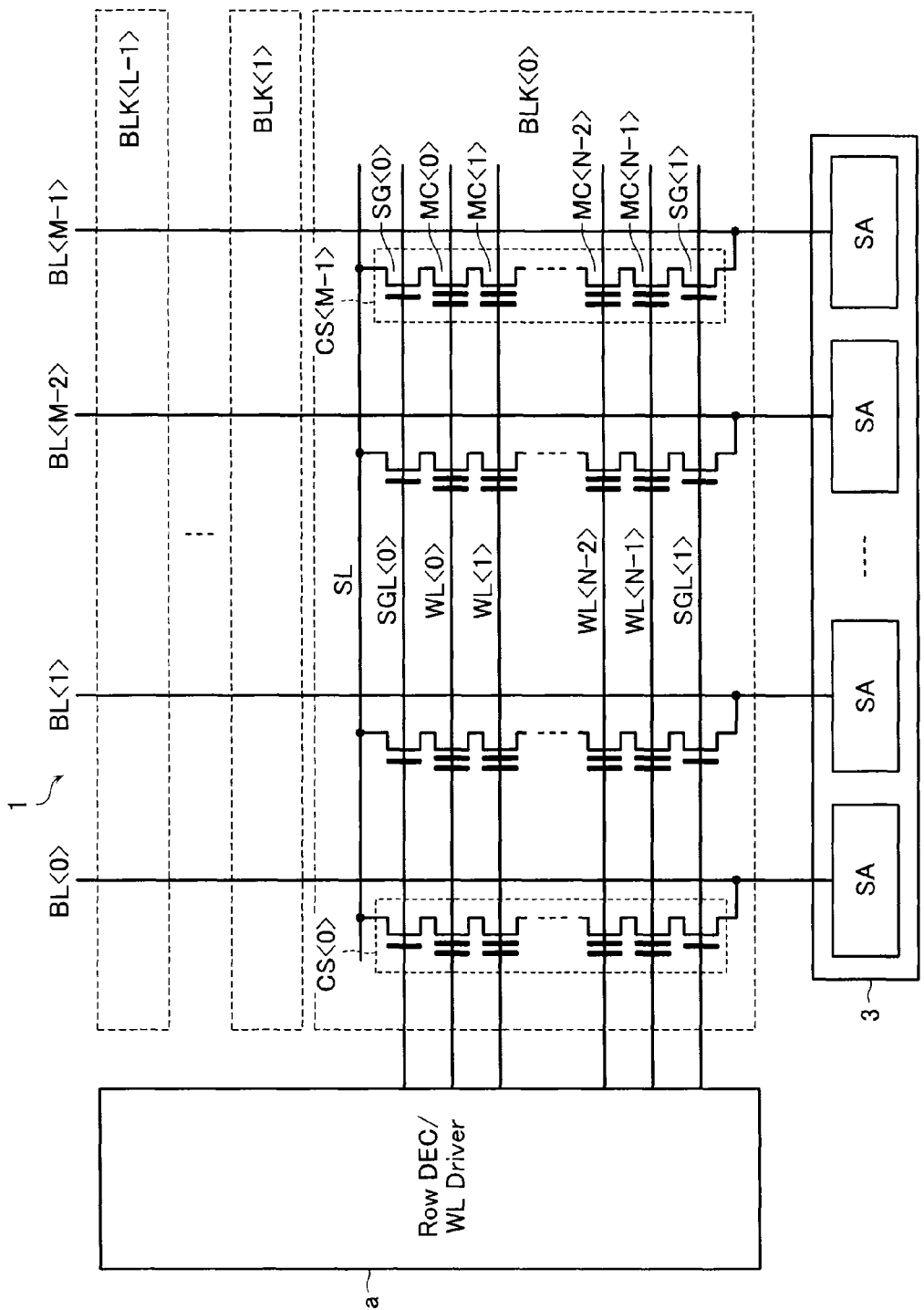
FIG. 2 is a circuit diagram of a cell array of the nonvolatile semiconductor memory device according to the same embodiment.

FIG. 2 is a circuit diagram of the cell array of the nonvolatile semiconductor memory device according to the present embodiment.

The cell array 1 includes: word lines WL<0> to WL<N-1>, select gate lines SGL<0> and SGL<1>, and a source line SL extending in the row direction; bit lines BL<0> to BL<M-1> extending in the column direction; and cell strings CS<0> to CS<M-1> provided corresponding to each of the bit lines BL<0> to BL<M-1>. Each of the cell strings CS includes N memory cells MC<0> to MC<N-1> connected in series, and select gates SG<0> and SG<1> connected to both ends of these series-connected memory cells MC. Each of the memory cells MC is configured from a transistor having a structure in which a floating gate, acting as a charge accumulation layer, and a control gate are stacked, via an insulating film, on a well (sometimes also referred to below as "cell well") of a semiconductor substrate. Moreover, the select gate SG is configured from a transistor having a structure in which a gate is stacked, via an insulating film, on a well of the semiconductor substrate. Note that a transistor having a structure similar to that of the memory cell MC can be utilized in the select gate SG, by short-circuiting the floating gate and the control gate.

A source of the select gate SG<0> is connected to the source line SL. A drain of the select gate SG<1> is connected to one of the bit lines BL<0> to BL<M-1>. Control gates of the memory cells MC<0> to MC<N-1> are connected to the word lines WL<0> to WL<N-1>. Gates of the select gates SG<0> and SG<1> are connected to the select gate lines SGL<0> and SGL<1>.

In the above-described configuration, the M cell strings CS aligned in the row direction configure one block BLK. The cell array 1 includes L blocks BLK<0> to BLK<L-1> aligned in the column direction. The data erase of the flash memory is performed in a unit of this block.

The word line WL and the select gate line SGL are driven by the row decoder 2a. Moreover, each of the bit lines BL is connected to a sense amplifier circuit SA of the page buffer 3.

Next, data storage of the memory cell MC will be described.

Figure 3:
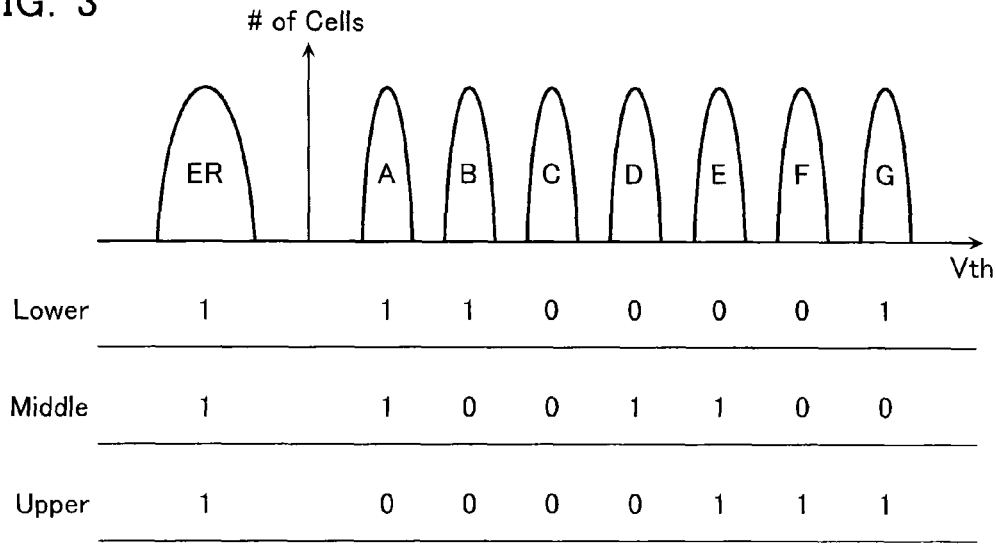
FIG. 3 is a view showing threshold voltage distributions of a memory cell of the nonvolatile semiconductor memory device according to the same embodiment.

FIG. 3 is a view showing threshold voltage distributions of the memory cell of the nonvolatile semiconductor memory device according to the present embodiment. FIG. 3 shows the case of 3 bits per cell.

The memory cell MC stores a plurality of data by a plurality of different threshold voltage distributions, in a nonvolatile manner. In the case of 3 bits per cell, each of the memory cells MC has eight threshold voltage distributions, that is, in order from a low voltage side, threshold voltage distributions of an ER level, an A level, a B level, a C level, a D level, an E level, an F level, and a G level, and respectively allocates to these eight threshold voltage distributions '111', '011', '001', '000', '010', '110', '100', and '101' to store 3-bit data. A threshold voltage Vth of the memory cell MC is determined by the number of electrons stored by the floating gate. A state of an ER level memory cell is sometimes also referred to below as "erase state", and a state of an A level through G level memory cell is sometimes also referred to below as "program state".

It should be noted that although each of the embodiments will be described below assuming the case of 3 bits per cell, each of the embodiments may be applied also in the case of 1 bit per cell or 2 or more bits per cell.

Hereafter, a method of operating the nonvolatile semiconductor memory device will be described.

As previously mentioned, the data write/erase/read on the memory cell is achieved by a series of processes called a sequence. The write sequence is configured from two operations, that is, a program operation and a program verify operation. The erase sequence is configured from an erase operation and an erase verify operation. The read sequence is configured from a read operation. Accordingly, each of the operations in these sequences will be described simply below.

First, the program operation of the present embodiment will be described.

Figure 4:
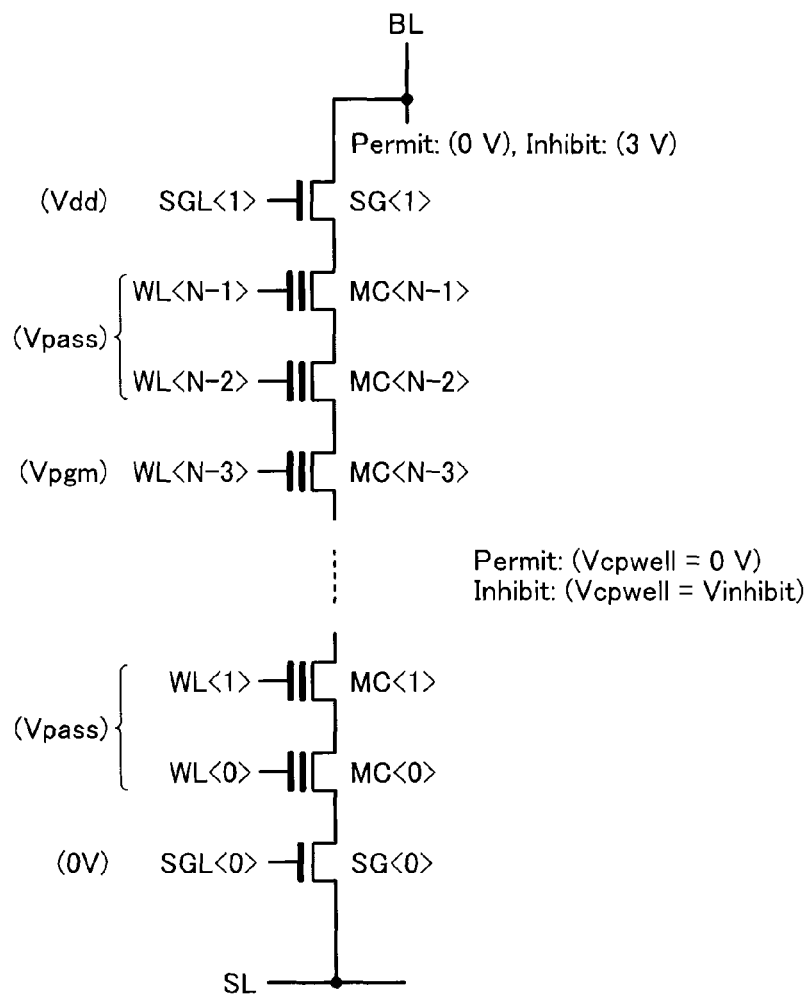
FIG. 4 is a view showing a bias state of the cell array during a program operation in the nonvolatile semiconductor memory device according to the same embodiment.

FIG. 4 is a view showing a bias state of the cell array during the program operation in the nonvolatile semiconductor memory device according to the present embodiment. FIG. 4 is an example of the case where the memory cell MC<N-3> is assumed to be a selected memory cell.

The program operation is an operation causing a memory cell MC in the erase state to undergo transition to the program state.

In the case of causing the memory cell MC to undergo transition to the program state, in other words, in the case of permitting a program on the memory cell MC, the cell well is set to, for example, a voltage Vcpwell=0 V, the select gate line SGL<0> is applied with, for example, 0 V, the select gate line SGL<1> is applied with, for example, a power supply voltage Vdd, and the bit line BL is applied with, for example, 0 V. In addition, an unselected word line WL is applied with a pass voltage Vpass (for example, 10 V), and a selected word line WL<N-3> is applied with a program voltage Vpgm (for example, 20 V). Hence, a large potential difference occurs between the cell well and the selected word line WL<N-3>, and electrons are injected into the floating gate of the selected memory cell MC<N-3>. As a result, the threshold voltage Vth of the selected memory cell MC<N−3> rises, whereby the selected memory cell MC<N−3> attains the program state.

In the case of not causing the memory cell MC to undergo transition to the program state, in other words, in the case of inhibiting the program on the memory cell MC, the select gate line SGL<0> is applied with, for example, 0 V, the select gate line SGL<1> is applied with the power supply voltage Vdd, and the bit line BL is applied with, for example, 3 V. In addition, the unselected word line WL is applied with the pass voltage Vpass, and the selected word line WL<N−3> is applied with the program voltage Vpgm (for example, 20 V). In this case, the voltage Vcpwell of the cell well rises to a certain inhibit voltage Vinhibit due to the influence of coupling with the word line WL. Hence, a large potential difference does not occur between the cell well and the selected word line WL<N−3>, and injection of electrons into the floating gate of the selected memory cell MC<N−3> is inhibited. As a result, the selected memory cell MC<N−3> is maintained unchanged in the erase state, without its threshold voltage Vth undergoing transition.

Next, the erase operation of the present embodiment will be described.

Figure 5:
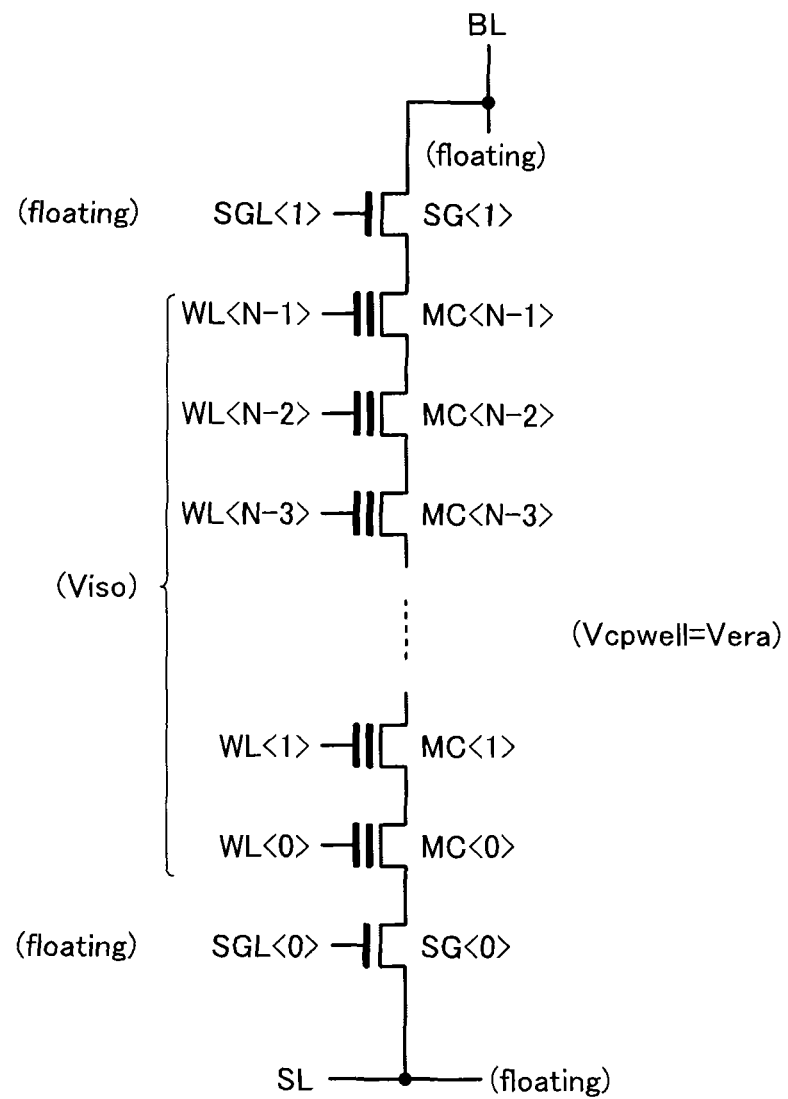
FIG. 5 is a view showing a bias state of the cell array during an erase operation in the nonvolatile semiconductor memory device according to the same embodiment.

FIG. 5 is a view showing a bias state of the cell array during the erase operation in the nonvolatile semiconductor memory device according to the present embodiment.

The erase operation is an operation causing a memory cell MC to undergo transition to the erase state.

In the case of causing the memory cell MC to undergo transition to the erase state, the select gate lines SGL<0> and SGL<1> and the bit line BL are set to a floating state. In addition, the cell well is set to an erase voltage Vcpwell=Vera (for example, 15 to 20 V), and all of the word lines WL are applied with a control voltage Viso (for example, 0.5 V). Hence, electrons are extracted from the floating gate of all of the memory cells MC. As a result, the threshold voltage Vth of all of the memory cells MC lowers, whereby all of the memory cells MC attain the erase state.

Note that the control voltage employed in the erase operation may be Viso=0 V. However, applying a positive voltage as the control voltage Viso as in the example of FIG. 5 makes it possible to improve cut-off characteristics of a transfer gate-dedicated transistor supplying the control voltage Viso provided between the row decoder/word line driver 2a and each of the blocks BLK. As a result, the transfer-dedicated transistor corresponding to an unselected block BLK can be cut off more reliably than in the case where the control voltage is Viso=0 V, hence a mistaken erase of the unselected block BLK can be suppressed.

Next, the read operation of the present embodiment will be described.

Figure 6:
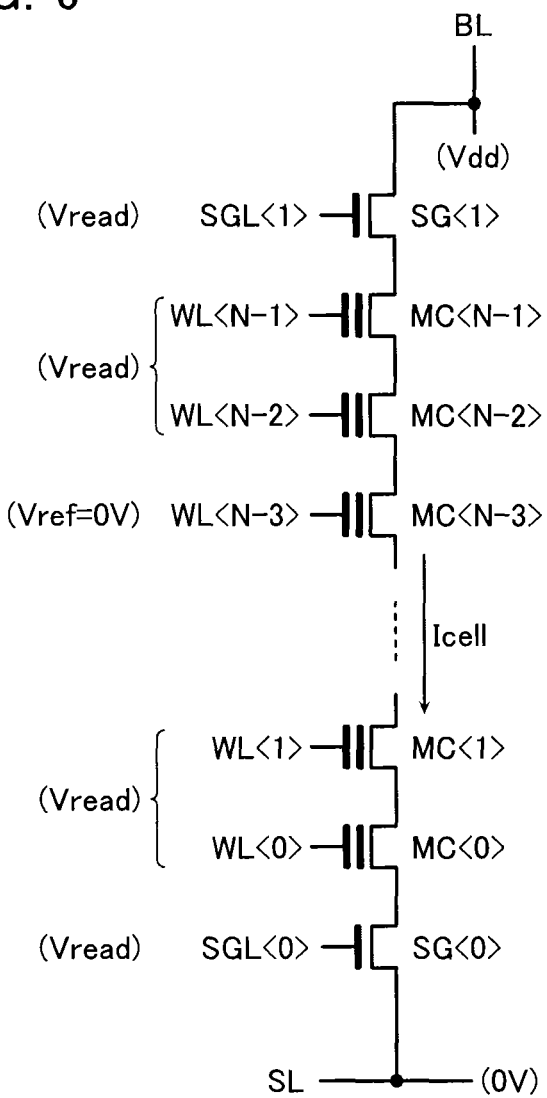
FIG. 6 is a view showing a bias state of the cell array during a read operation in the nonvolatile semiconductor memory device according to the same embodiment.

FIG. 6 is a view showing a bias state of the cell array during the read operation in the nonvolatile semiconductor memory device according to the present embodiment. FIG. 6 is an example of the case where the memory cell MC<N−3> is assumed to be the selected memory cell.

In the case of reading data from the memory cell MC, the bit line BL is pre-charged to the power supply voltage Vdd, the source line SL is applied with, for example, 0 V, the select gate lines SGL<0> and SGL<1> and the unselected word line WL are applied with a read voltage Vread (for example, 4.5 V), and the selected word line WL<N−3> is applied with a reference voltage Vref (for example, 0 V). As a result, if the threshold voltage of the selected memory cell MC<N−3> is Vth<0 V, then all of the transistors of the cell string CS including the selected memory cell MC<N−3> attain an on state, and a cell current Icell flows from the bit line BL to the source line SL. On the other hand, if the threshold voltage of the selected memory cell MC<N−3> is Vth>0 V, then the transistor of the selected memory cell MC<N−3> attains an off state, hence the cell current Icell does not flow in the cell string CS. The control unit detects presence/absence of the cell current Icell flowing in the bit line BL by the sense amplifier circuit SA, thereby determining the threshold voltage Vth of the memory cell MC.

Next, the program verify operation of the present embodiment will be described.

The program verify operation is the same as the above-described read operation excluding the selected word line WL being applied with a verify voltage Vvfy (for example 0.5 V). Now, the verify voltage Vvfy is a voltage of a lower limit of the threshold voltage distribution of the program state. Employing this verify voltage Vvfy makes it possible to find out whether the threshold voltage of the memory cell MC is Vth>Vvfy, whereby it can be confirmed whether the memory cell MC has undergone transition to the program state.

Next, the erase verify operation of the present embodiment will be described.

The erase verify operation is an operation confirming whether all of the memory cells MC of the block BLK have been caused to undergo transition to the erase state by the erase operation.

Figure 7:
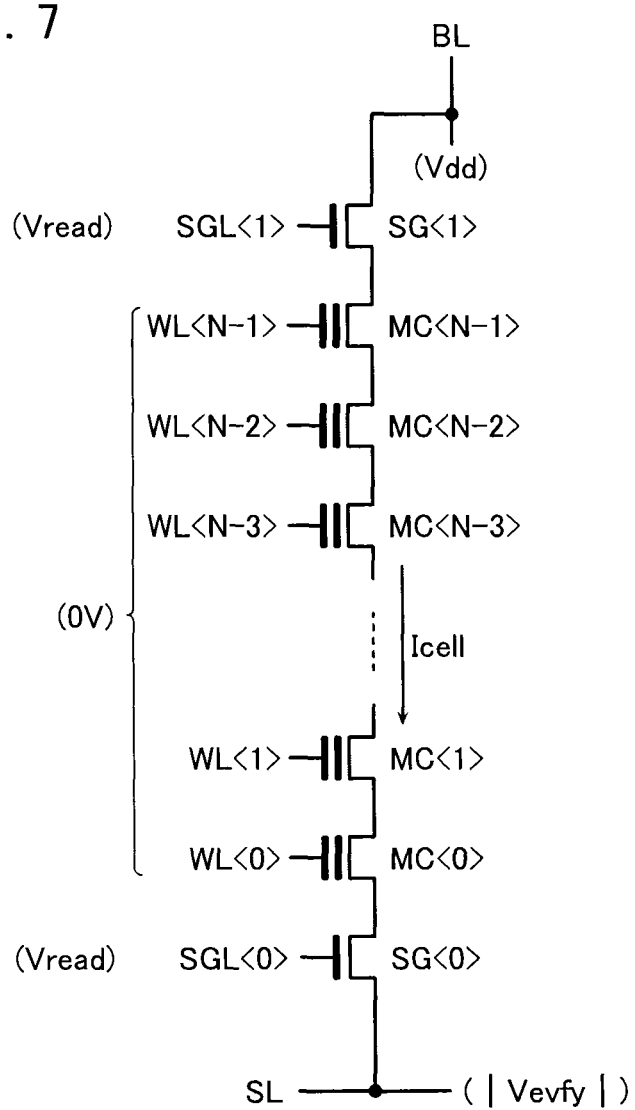
FIG. 7 is a view showing a bias state of the cell array during an erase verify operation in the nonvolatile semiconductor memory device according to the same embodiment.

FIG. 7 is a view showing a bias state of the cell array during the erase verify operation in the nonvolatile semiconductor memory device according to the present embodiment.

It is possible to employ, for example, a so-called negative sensing system erase verify operation in confirmation of whether the memory cell MC is in the erase state. In other words, the bit line BL is pre-charged to the power supply voltage Vdd, and the source line SL is applied with a positive voltage (for example, 1.0 V) having the same magnitude as an erase verify voltage Vevfy (for example, −1.0 V). Now, the erase verify voltage Vevfy is a voltage of an upper limit of the threshold voltage distribution of the erase state. In addition, the select gate lines SGL<0> and SGL<1> are applied with the read pass voltage Vread, and all of the word lines WL are applied with, for example, 0 V as a reference voltage. As a result, if the threshold voltage of all of the memory cells MC is Vth<Vevfy, then all of the transistors of the cell string CS attain an on state, and a cell current Icell flows from the bit line BL to the source line SL. On the other hand, if the threshold voltage of at least some of the memory cells MC is Vth>Vevfy, then the transistors of said memory cells MC attain an off state, hence the cell current Icell does not flow in the cell string CS. The control unit detects presence/absence of the cell current Icell flowing in the bit line BL by the sense amplifier circuit SA, whereby it can be confirmed whether all of the memory cells MC have undergone transition to the erase state.

Next, an example of a 3-bit data write to the memory cell MC when employing the above-described program operation, will be described.

Figure 8:
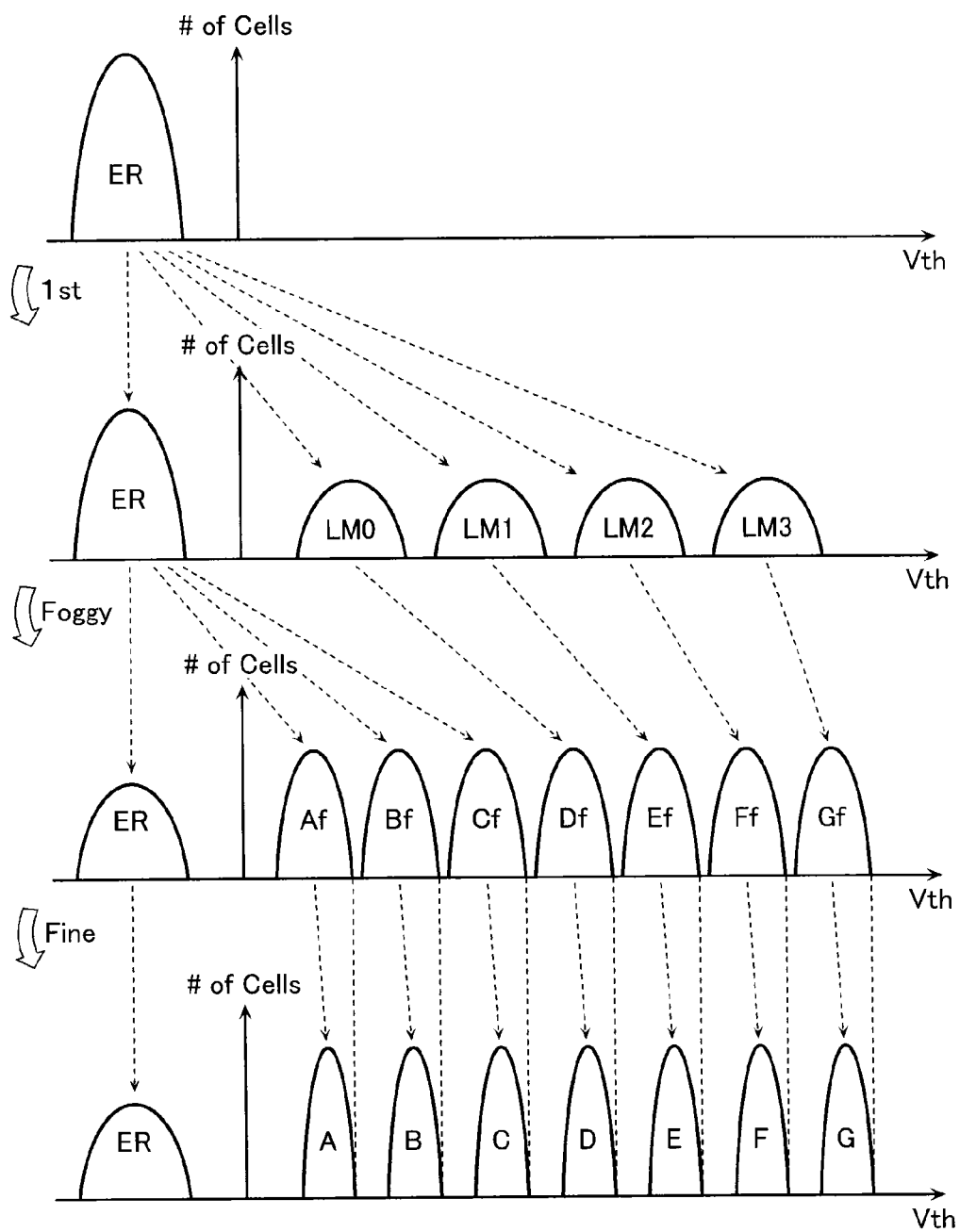
FIG. 8 is a view showing a state of transition of the threshold voltage distributions of the memory cell during a write sequence in the nonvolatile semiconductor memory device according to the same embodiment.

FIG. 8 is a view showing a state of transition of the threshold voltage distributions of the memory cell during the write sequence in the nonvolatile semiconductor memory device according to the present embodiment.

In this example, 3-bit data is written by executing three stages of write steps on the memory cell MC in the erase state.

In an initial first stage write step ("1st" in FIG. 8, sometimes also referred to as "first write step"), an ER level memory cell MC is caused to undergo transition to an intermediate level. The intermediate level has four levels specified therein, that is, from a low voltage side to a high voltage side, an LM0 level through LM3 level. If the memory cell MC is finally to be set to the ER level through C level, its threshold voltage Vth is maintained unchanged at the ER level. On the other hand, if the memory cell MC is finally to be set to the D level through G level, its threshold voltage Vth is caused to undergo transition from the ER level to an LM0 level through LM3 level, respectively.

In a following second stage write step ("Foggy" in FIG. 8, sometimes also referred to as "foggy write step"), a coarse program causing the ER level or intermediate level memory cell MC to undergo transition to a foggy level, is performed. The foggy level is a threshold voltage distribution whose width is broader than a level (fine level) finally to be set, and has seven levels specified therein, that is, from a low voltage side to a high voltage side, an Af level through Gf level. If the memory cell MC is finally to be set to the ER level, its threshold voltage Vth is maintained unchanged at the ER level. On the other hand, if the memory cell MC is finally to be set to the A level through C level, its threshold voltage Vth is caused to undergo transition from the ER level to the Af level through Cf level, respectively. Moreover, if the memory cell MC is finally to be set to the D level through G level, its threshold voltage Vth is caused to undergo transition from the LM0 level through LM3 level to the Df level through Gf level, respectively.

In a final third stage write step ("Fine" in FIG. 8, sometimes also referred to as "fine write step"), a fine program causing the ER level or foggy level memory cell MC to undergo transition to a final fine level, in other words, the ER level and A level through G level, is performed. If the memory cell MC is to be set to the ER level, its threshold voltage Vth is maintained unchanged at the ER level. On the other hand, if the memory cell MC is to be set to the A level through G level, the memory cell MC on a lower tail side of the Af level through Gf level is programmed to narrow a distribution width of each of the levels. As a result, the memory cell MC is set with the final narrow distribution width level A through level G.

Next, an example of a write sequence of pages in the block BLK will be described.

In the case of a NAND type flash memory, data is written in order, in units of the page, from a source line SL side to a bit line BL side of the block BLK. However, in the case of simply completing the write sequence on one page, and then starting the write operation on the next page in the manner of first write step→foggy write step→fine write step on page<0> (where page<n> is assumed to refer to the page configured from the plurality of memory cells MC connected to the word line WL<n>), first write step→foggy write step→fine write step on page<1> . . . , it sometimes also occurs that the influence of coupling with the adjacent word line WL cannot be fully compensated, leading to a problem of disturbance where the threshold voltage Vth of a write-completed memory cell MC varies.

Accordingly, in the present embodiment, the data write is advanced by a sequence of the kind described below, for example.

Figures 9, 10:
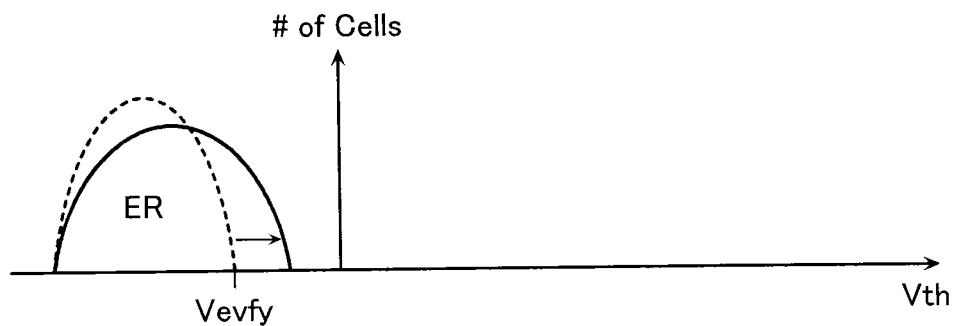
FIG. 9 is a view showing a write sequence of pages in a data write of the nonvolatile semiconductor memory device according to the same embodiment.
FIG. 10 is a view showing a state of transition of the threshold voltage distribution of the memory cell during the read operation in the nonvolatile semiconductor memory device according to the same embodiment.

FIG. 9 is a view showing the write sequence of pages in the data write of the nonvolatile semiconductor memory device according to the present embodiment. FIG. 9 is an example of the case of storing 256 bits per one cell string.

In the case of FIG. 9, the data write is executed in an order of first write step on page<0>→first write step on page<1>→foggy write step on page<0>→first write step on page<2>→foggy write step on page<1>→fine write step on page<0> . . . first write step on page<85>→foggy write step on page<84>→fine write step on page<83>→foggy write step on page<85>→fine write step on page<84>→fine write step on page<85>. In this case, even if a write step on page<n+1> causes the threshold voltage Vth of the memory cell MC of page<n> to end up varying, a write step on page<n> is later executed. As a result, the influence of the write step on page<n+1> can be canceled out afterwards. In other words, employing the write sequence of pages shown in FIG. 9 makes it possible to reduce the influence of coupling with the word line WL during the write step of the adjacent page.

The above represents the basic method of operating the nonvolatile semiconductor memory device according to the present embodiment. However, simply employing the above-described method of operating may lead to the following kinds of problems.

FIG. 10 is a view showing a state of transition of the threshold voltage distribution of the memory cell during the read operation in the nonvolatile semiconductor memory device according to the present embodiment.

Here, the following case is considered, that is, the case where data is newly added to page<n1> (where n1 is an integer of 1 to N−1) through page<N−1> of a block BLK<11> (where 11 is an integer of 0 to L−1) (sometimes also referred to below as "target block") that already has valid data written to page<0> through page<n1−1> thereof. This is corresponded to by, for example, the case where when writing a group of data to page<0> through page<N−1> of the target block BLK<11>, a command of suspend is issued from the controller 11 at a time point when the write has proceeded to page<n1−1> to suspend the data write.

It is assumed that under these circumstances, during data write suspension, a read of the valid data (referred to below as "existing data") already stored in page<0> through page<n1−1> of the target block BLK<11> is executed. In this case, as previously mentioned, the unselected word line WL in the target block BLK<11> is applied with the read voltage Vread, but sometimes this read voltage Vread exerts an influence whereby the threshold voltage Vth of the unselected memory cell MC rises. Moreover, these unselected memory cells MC include also an erase state memory cell MC belonging to page<n1> through page<N−1> prior to the data write. In other words, as shown by the arrow of FIG. 10, the threshold voltage distribution of the memory cell MC of page<n1> through page<N−1> sometimes ends up extending on an upper tail side. Moreover, when a command of resume is issued from the controller 11 whereby the data write is resumed, these memory cells MC whose threshold voltage Vth has ended up rising undergo execution of a data write assuming them to be in the erase state, hence it becomes easier for a mistaken write to Occur.

Accordingly, in the present embodiment, the data write is devised as follows.

Figure 11:
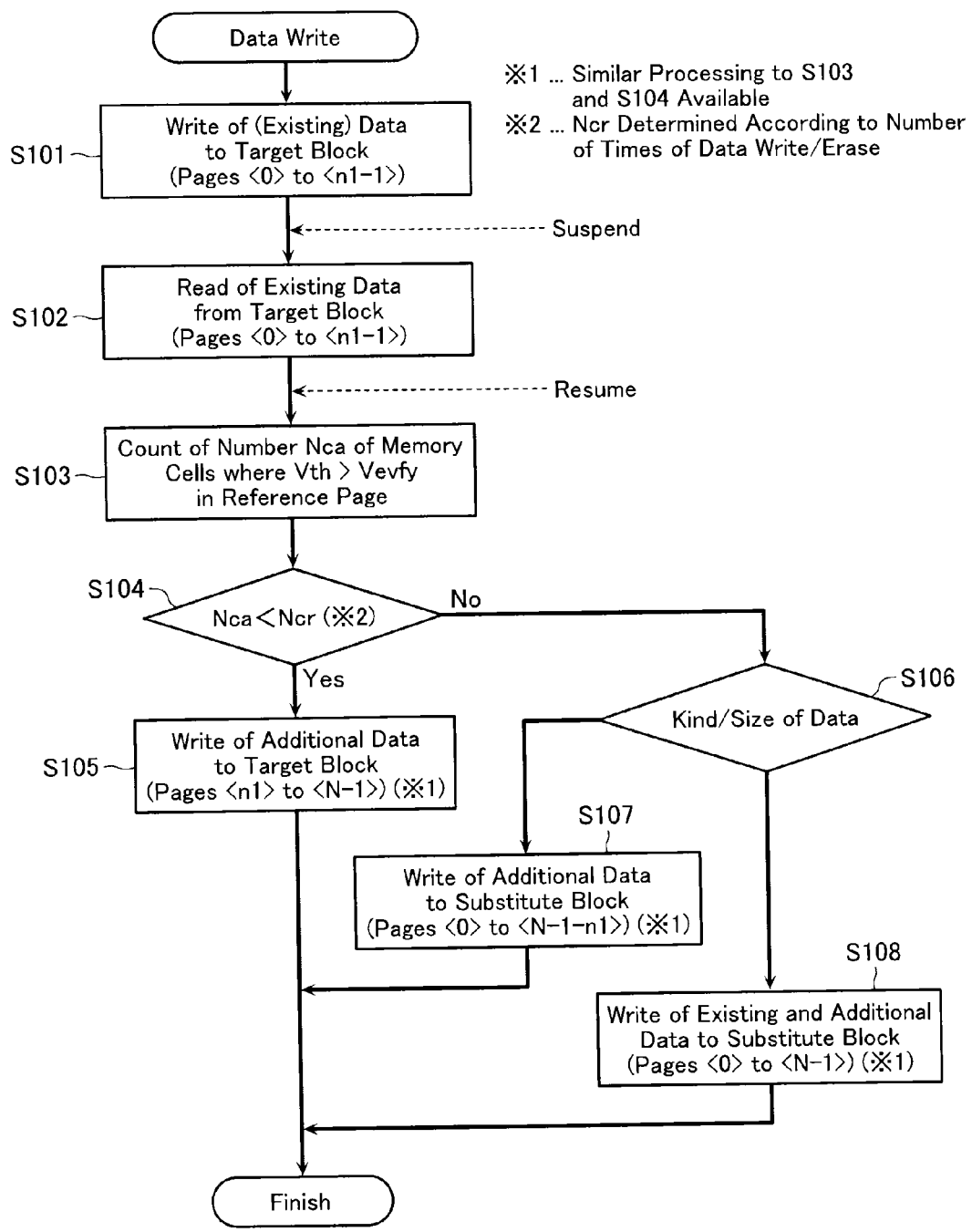
FIG. 11 is a flowchart of the data write in the nonvolatile semiconductor memory device according to the same embodiment.

FIG. 11 is a flowchart of the data write in the nonvolatile semiconductor memory device according to the present embodiment. FIG. 11 is a flow after the data erase has been executed on the target block.

First, in step S101, the control unit writes the group of data in order from page<0> of the target block BLK<11>.

Now, when the command of suspend is issued from the controller 11, the control unit suspends the data write. At this time point, data (existing data) is assumed to have been written from page<0> through page<n1−1> of the target block BLK<11>. During data write suspension, processing of the likes of the read on the existing data on page<0> through page<n1−1> of the target block BLK<11>, is performed (step S102). Then, when the processing finishes, the command of resume is issued from the controller 11.

Following this, the control unit receives the command of resume to resume the data write, but in following steps S103 and S104, performs pre-processing for that resumption. This pre-processing is a processing that determines the influence that the read voltage Vread exerts on the pre-data write pages. In step S103, a data read adopting as a reference page a specific page of pre-data write page<n1> through page<N−1> in the target block BLK<11>, is performed, and the number Nca of memory cells having a threshold voltage Vth higher than a specific value (for example, the erase verify voltage Vevfy which is an upper limit value of the ER level shown in FIG. 10) in this reference page, is counted. In following step S104, if the number Nca of memory cells is less than a certain reference number Ncr, then processing is shifted to step S105. On the other hand, if the number Nca of memory cells is the reference number Ncr or more, then processing is shifted to step S106.

Following step S105 is a step executed when the influence of the read voltage Vread on pre-data write page<n1> through page<N−1> was small. In this step S105, the control unit writes remaining data (sometimes also referred to below as "additional data") to page<n1> through page<N−1> of the target block BLK<11>, as a continuation of the suspended data write.

On the other hand, step S106 and steps S107 and S108 following step S106 are steps executed when the influence of the read voltage Vread on pre-data write page<n1> through page<N−1> is large.

In step S106, the control unit shifts processing selecting one of two different data write steps S107 and S108, in view of processing efficiency due to the likes of kind or size of the existing data and the additional data.

In step S107, the control unit writes only the additional data in a block BLK<12> (where 12 is an integer of 0 to L−1 excluding 11) (sometimes also referred to below as "substitute block") different from the target block BLK<11>. This step S107 is effective, for example, when the existing data and the additional data are code of a program, and so on, where size is comparatively small and there are few occasions of batch reading.

On the other hand, in step S108, the control unit, in addition to writing the additional data to the substitute block BLK<12>, also freshly rewrites the existing data already written to the target block BLK<11>, to the substitute block BLK<12>. Moreover, the control unit destroys the existing data of the target block BLK<11>. This step S108 is effective, for example, when the existing data and the additional data are graphics data, and so on, where size is comparatively large and there are many occasions of batch reading.

Note that in steps S105, S107, and S108, when a suspend/resume command is issued during processing, processing similar to that of steps S103 and S104 adopting the mid-data write block BLK as the target block, is performed.

The above is the flow of the data write of the present embodiment.

In the data write shown in FIG. 11, steps S103 and S104 detect the threshold voltage Vth of the pre-data write memory cells MC of the target block BLK<11>, thereby predicting ease of occurrence of a mistaken write when the additional data is written to the target block BLK<11>. Moreover, when it is determined that a mistaken write is easily generated, steps S107 and S108 write the additional data to the substitute block BLK<12>, thereby avoiding generation of a mistaken write occurring when the additional data is added to the target block BLK<11>.

Next, variations of the write operation described using the flowchart of FIG. 11, will be referred to.

First, a method of selecting the reference page in step S103 will be described.

As previously mentioned, steps S103 and S104 of the data write shown in FIG. 11 are steps determining the influence that the read voltage Vread exerts on the pre-data write pages. Considering this point only, since the word lines WL corresponding to each of the unselected pages are equally applied with the read voltage Vread, then any of the pages may be selected as the reference page, provided it is a pre-data write page. For example, page<N−1> on which the data write is last performed in the target block BLK may be fixed as the reference page. In this case, there is no need to change the reference page according to a state of progress of the data write, hence control can be performed simply.

Moreover, the program voltage Vpgm applied to the selected word line WL during the data write also exerts an influence on the threshold voltage Vth of the unselected memory cell MC, and in view of this influence, it is also possible to adopt as the reference page a page situated as much as possible to the source line SL side of the pre-data write pages, that is, a page closer to the pages where data has been written. For example, in the case that when the data write is advanced in the sequence of FIG. 9, the most recent write step last executed before data write suspension was on page<n2> (where n2 is an integer of 0 to n1−1), it is possible to select page<n2+3> as the reference page. If selection is made in this way, it is possible to adopt as the reference page a page which is certainly pre-data write, and is adjacent to the selected page to possibly receive the influence of the program voltage Vpgm, irrespective of what stage of write step the most recent write step was. Generally, in the case of executing by M times (where M is an integer of 1 or more) of the write step for each memory cell MC and when the most recent write step was on page<n2>, it is possible to select page<n2+M> as the reference page. This method of selecting makes it possible to more reliably determine the state of transition of the threshold voltage Vth and appropriately avoid a mistaken write, compared to when page<N−1> is always adopted as the reference page.

Furthermore, when it is desired to appropriately avoid a mistaken write, the reference page may be selected in view of what stage the most recent write step is. In other words, in the case that when the data write is advanced in the sequence of FIG. 9, the most recent write step was on page<n2> and was a first write step, the most recent write step was on page<n2> and was a foggy write step, and the most recent write step was on page<2> and was a fine write step, it is possible to select page<n2+1>, page<n2+2>, and page<n2+3>, respectively, as the reference page. If selection is made in this way, it is possible to adopt as the reference page a page which is certainly pre-data write, and is adjacent to the selected page to be closest to the selected page receiving the influence of the program voltage Vpgm, inconsideration of what stage of write step the most recent write step was. Generally, in the case of executing by M times of the write step for each memory cell MC and when the most recent write step was an m-th stage (where m is an integer of 1 to M) write step of page<n2>, it is possible to select page<n2+m> as the reference page. This method of selecting makes it possible to more reliably determine the state of transition of the threshold voltage Vth and appropriately avoid a mistaken write, compared to when page<n2+M> is adopted as the reference page.

The above-described method of selecting the reference page can be selected in view of complexity of processing or specifications such as error processing capacity included in the nonvolatile semiconductor memory device.

Note that when the most recent write step is on a page close to the bit line BL and the reference page cannot be selected by the above-described method of selecting, steps S103, S104, and S106 through S108 may be omitted.

Next, the reference number Ncr will be described.

The reference number Ncr can be determined in view of error processing capacity included in the nonvolatile semiconductor memory device, and so on. Moreover, considering that endurance of the memory cell MC changes by the number of times of data write/erase on the target block, it is also possible to prepare a plurality of reference numbers Ncr according to the number of times of data write/erase.

As described above, in the case of the data write of the present embodiment, it is possible to detect the threshold voltage of the pre-data write memory cells to predict how easily a mistaken write occurs, and thereby suppress a mistaken write occurring due to a later resumed data write. In other words, the present embodiment makes it possible to provide a nonvolatile semiconductor memory device where there are few mistaken writes of data.

Note that the description above proceeded assuming the case where the data write is suspended in the process of writing a group of data and the remaining data is added from mid-way in the target block. However, the present invention is not limited to this case, and provided that data is added to a block already written with valid data, the present embodiment may be applied even when the existing data and the additional data are completely different data. Moreover, described above was the case of employing a 3 bits per cell memory cell. However, the present embodiment can be applied even in the case of a 1 bit per cell memory cell, a 2 or more bits per cell memory cell, or where these are mixed. Regarding these points, the same applies also to the embodiments below.

Second Embodiment

The first embodiment detected the threshold voltage of the memory cells of the reference page, thereby determining how much the threshold voltage of the pre-data write memory cells has changed, to predict ease of occurrence of a mistaken write. In contrast, the second embodiment estimates how much the threshold voltage of the pre-data write memory cells has changed by the number of times of read of the existing data, to predict ease of occurrence of a mistaken write.

Figure 12:
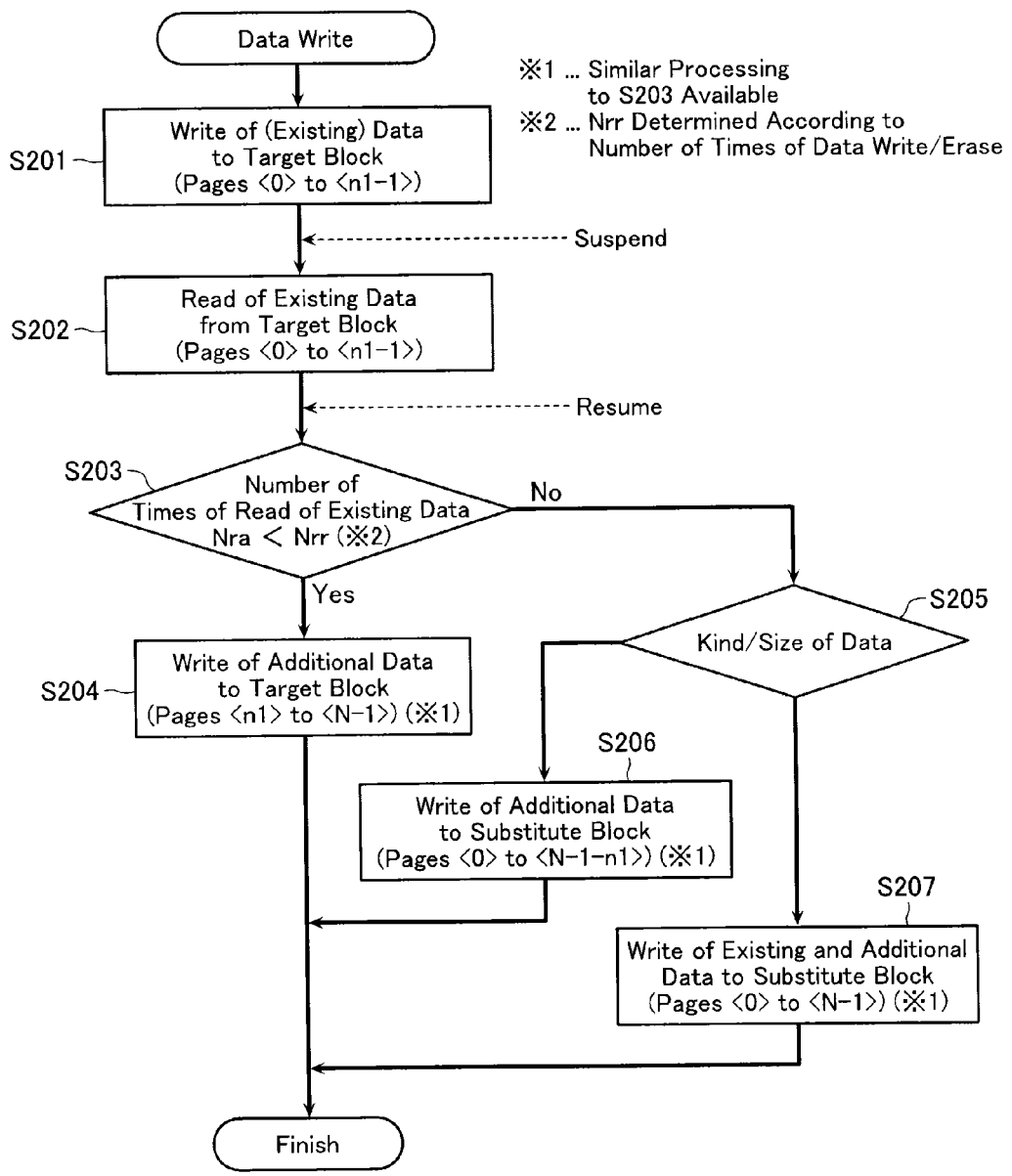
FIG. 12 is a flowchart of a data write in a nonvolatile semiconductor memory device according to a second embodiment.

FIG. 12 is a flowchart of a data write in a nonvolatile semiconductor memory device according to the second embodiment. FIG. 12 is a flow after the data erase has been executed on the target block.

Initial step S201, following suspend, step S202, and resume are similar to step S101, following suspend, step S102, and resume of FIG. 11.

In following step S203, the influence that the read voltage Vread exerts on the pre-data write pages is determined, similarly to in steps S103 and S104 of FIG. 11. However, in step S203, the control unit determines whether the number of times Nra of read of the existing data stored in page<0> through page<n1−1> of the target block BLK<11> executed during data write suspension is less than a certain reference number of times Nrr. If the number of times Nra of read is less than the reference number of times Nrr, in other words, if there are few data reads on the existing data during data write suspension, and transition of the threshold voltage Vth of the memory cells MC of pre-data write page<n1> through page<N−1> is thought to be small, then processing is shifted to step S204. On the other hand, if the number of times Nra of read is the reference number of times Nrr or more, in other words, if there are many data reads on the existing data during data write suspension, and transition of the threshold voltage Vth of the memory cells MC of pre-data write page<n1> through page<N−1> is thought to be large, then processing is shifted to step S205.

In following steps S204 through S207, processing similar to that in steps S105 through S108 of FIG. 11 is performed.

Note that in steps S204, S206, and S207, when a suspend/resume command is issued during processing, processing similar to that of step S203 adopting the mid-data write block BLK as the target block, is performed, similarly to in the first embodiment.

The above is the flow of the data write of the present embodiment.

Note that the reference number of times Nrr can be determined in view of error processing capacity included in the nonvolatile semiconductor memory device, and so on. Moreover, considering that endurance of the memory cell MC changes by the number of times of data write/erase on the target block, it is also possible to prepare a plurality of reference numbers of times Nrr according to the number of times of data write/erase.

As described above, in the case of the data write of the present embodiment, it is possible to predict how easily a mistaken write occurs based on the number of times of read of the existing data, and thereby suppress a mistaken write occurring due to a later resumed data write. In other words, the present embodiment makes it possible to provide a nonvolatile semiconductor memory device where there are few mistaken writes of data, similarly to the first embodiment.

Third Embodiment

In a third embodiment, a data write combining the data writes of the first and second embodiments will be described.

Figure 13:
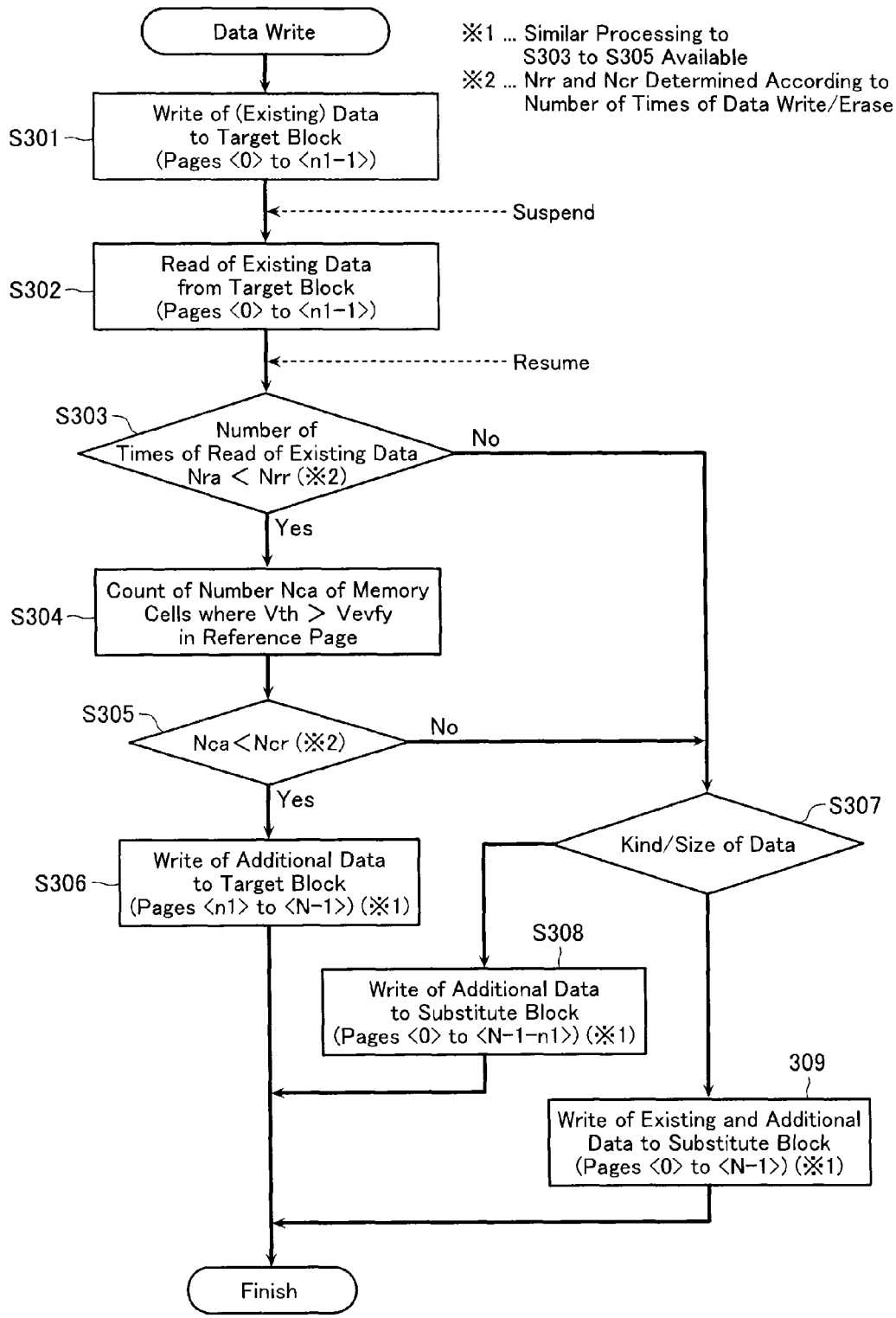
FIG. 13 is a flowchart of a data write in a nonvolatile semiconductor memory device according to a third embodiment.

FIG. 13 is a flowchart of a data write in a nonvolatile semiconductor memory device according to the third embodiment. FIG. 13 is a flow after the data erase has been executed on the target block.

Initial step S301, following suspend, step S302, and resume are similar to step S101, following suspend, step S102, and resume of FIG. 11.

In following step S303, processing similar to that in step S203 of FIG. 12 is performed. In other words, in step S303, the control unit determines whether the number of times Nra of read of the existing data stored in page<0> through page<n1−1> of the target block BLK<11> executed during data write suspension is less than a certain reference number of times Nrr (first requirement). If the number of times Nra of read is less than the reference number of times Nrr, then processing is shifted to step S304. On the other hand, if the number of times Nra of read is the reference number of times Nrr or more, then processing is shifted to step S307.

In following steps S304 and S305, processing similar to that in steps S103 and S104 of FIG. 11 is performed. In other words, the number Nca of memory cells having a threshold voltage Vth higher than a specific value belonging to a reference page is counted, and it is determined whether the number Nca of memory cells is less than a certain reference number Ncr (second requirement). If the number Nca of memory cells is less than the reference number Ncr, then processing is shifted to step S306. On the other hand, if the number Nca of memory cells is the reference number Ncr or more, then processing is shifted to step S307.

In following steps S306 through S309, processing similar to that in steps S105 through S108 of FIG. 11 is performed.

Note that in steps S306, S308, and S309, when a suspend/resume command is issued during processing, processing similar to that of steps S303 through S305 adopting the mid-data write block BLK as the target block, is performed, similarly to in the first and second embodiments.

The above is the flow of the data write of the present embodiment.

Note that the reference number of times Nrr and the reference number Ncr can be determined in view of error processing capacity included in the nonvolatile semiconductor memory device, and so on, similarly to in the first and second embodiments. Moreover, considering that endurance of the memory cell MC changes by the number of times of data write/erase on the target block, it is also possible to prepare a plurality of reference numbers of times Nrr and reference numbers Ncr according to the number of times of data write/erase.

As described above, in the case of the data write of the present embodiment, by performing a determination based not only on detection of the threshold voltage of the pre-data write memory cells similar to that of the first embodiment, but also on the number of times of read of the existing data similar to that of the second embodiment, it is possible to more accurately predict how easily a mistaken write occurs, compared to in the first and second embodiments. In other words, the present embodiment makes it possible to provide a nonvolatile semiconductor memory device where there are fewer mistaken writes of data, compared to in the first and second embodiments.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
   a cell array including a source line, a plurality of bit lines, a plurality of word lines intersecting the plurality of bit lines, and a plurality of cell strings electrically connected between the source line and the plurality of bit lines, each of the cell strings being configured from a plurality of memory cells connected in series to each be connected to one of the word lines; and
   a control unit that performs a data write/erase/read on the memory cells,
   the cell array being divided into a plurality of blocks including a target block, each of the blocks including first through N-th pages (where N is an integer of 2 or more), each of the pages being configured by a plurality of the memory cells connected to one of the word lines,
   the control unit executing the data write/read in a unit of the page, and executing the data erase in a unit of the block, and
   the control unit, in the data write, determining at least one of:
   a first requirement that the number of times of the data read on first through n1-th pages (where n1 is an integer of 1 to N−1) of the target block executed after the most recent data erase on the target block, is less than a reference number of times; and
   a second requirement that the number of memory cells whose threshold voltage is higher than a reference voltage, of the plurality of memory cells of a reference page of n1+1-th through N-th pages of the target block, is less than a reference number, and
   when the determined requirement is satisfied, writing additional data to the n1+1-th through N-th pages of the target block.

2. The nonvolatile semiconductor memory device according to claim 1, wherein
   the control unit, in the data write, when the determined requirement is not satisfied, writes the additional data to a substitute block different from the target block, of the plurality of blocks.

3. The nonvolatile semiconductor memory device according to claim 2, wherein
   the control unit, in the data write, when the determined requirement is not satisfied, writes also existing data stored by the first through n1-th pages of the target block along with write of the additional data, to the substitute block, based on at least one of size and kind of the additional data.

4. The nonvolatile semiconductor memory device according to claim 1, wherein
   at least some of the plurality of memory cells store data of two or more bits.

5. The nonvolatile semiconductor memory device according to claim 4, wherein
   the control unit, in the data write, executes on each of the memory cells a plurality of write steps causing a threshold voltage of the memory cell to undergo transition to a desired value in stages, and the write step of an identical stage is executed in order of the first page, the second page, . . . , the N-th page in each of the blocks.

6. The nonvolatile semiconductor memory device according to claim 1, wherein
   the first through N-th pages of each of the blocks are disposed in order from a source line side to a bit line side.

7. A nonvolatile semiconductor memory device, comprising:
   a cell array including a source line, a plurality of bit lines, a plurality of word lines intersecting the plurality of bit lines, and a plurality of cell strings electrically connected between the source line and the plurality of bit lines, each of the cell strings being configured from a plurality of memory cells connected in series to each be connected to one of the word lines; and
   a control unit that performs a data write/erase/read on the memory cells,
   the cell array being divided into a plurality of blocks including a target block, each of the blocks including first through N-th pages (where N is an integer of 2 or more), each of the pages being configured by a plurality of the memory cells connected to one of the word lines,
   the control unit executing the data write/read in a unit of the page, and executing the data erase in a unit of the block, and
   the control unit, in the data write, subsequent to a first number of times of the data read on first through n1-th pages (where n1 is an integer of 1 to N−1) of the target block after the most recent data erase on the target block, writing additional data to n1+1-th through N-th pages of the target block, and subsequent to a second number of times greater than the first number of times of the data read on the first through n1-th pages of the target block after the most recent data erase on the target block, not writing the additional data to the n1+1-th through N-th pages of the target block.

8. The nonvolatile semiconductor memory device according to claim 7, wherein
the control unit, in the data write, subsequent to the second number of times of the data read on the first through n1-th pages of the target block after the most recent data erase on the target block, writes the additional data to a substitute block different from the target block, of the plurality of blocks.

9. The nonvolatile semiconductor memory device according to claim 7, wherein
the first number of times is a value less than a reference number of times, and
the second number of times is a value of the reference number of times or more.

10. The nonvolatile semiconductor memory device according to claim 9, wherein
the control unit determines the reference number of times based on the number of times of the data write/data erase on the target block.

11. A nonvolatile semiconductor memory device, comprising:
a cell array including a source line, a plurality of bit lines, a plurality of word lines intersecting the plurality of bit lines, and a plurality of cell strings electrically connected between the source line and the plurality of bit lines, each of the cell strings being configured from a plurality of memory cells connected in series to each be connected to one of the word lines; and
a control unit that performs a data write/erase/read on the memory cells,
the cell array being divided into a plurality of blocks including a target block, each of the blocks including first through N-th pages (where N is an integer of 2 or more), each of the pages being configured by a plurality of the memory cells connected to one of the word lines,
the control unit executing the data write/read in a unit of the page, and executing the data erase in a unit of the block, and
the control unit, after the data write on first through n1-th pages (where n1 is an integer of 1 to N−1) of the target block, suspending the data write, and then, when resuming the data write, executing the data read on a reference page of n1+1-th through N-th pages of the target block.

12. The nonvolatile semiconductor memory device according to claim 11, wherein
the control unit, when the number of memory cells whose threshold voltage is higher than a reference voltage, of the plurality of memory cells of the reference page, is a first number, writes additional data to the n1+1-th through N-th pages of the target block, and when the number of memory cells whose threshold voltage is higher than the reference voltage, of the plurality of memory cells of the reference page, is a second number larger than the first number, does not write the additional data to the n1+1-th through N-th pages of the target block.

13. The nonvolatile semiconductor memory device according to claim 12, wherein
the control unit, when the number of memory cells whose threshold voltage is higher than the reference voltage, of the plurality of memory cells of the reference page, is the second number, writes the additional data to a substitute block different from the target block, of the plurality of blocks.

14. The nonvolatile semiconductor memory device according to claim 12, wherein
the first number is a value less than a reference number, and the second number is a value of the reference number or more.

15. The nonvolatile semiconductor memory device according to claim 14, wherein
the control unit determines the reference number based on the number of times of the data write/data erase on the target block.

16. The nonvolatile semiconductor memory device according to claim 11, wherein
the control unit adopts as the reference page the page closest to the page on which the data write has been executed, of pages on which the data write has not been executed after the most recent data erase on the target block.

17. The nonvolatile semiconductor memory device according to claim 16, wherein
the control unit
executes on each of the memory cells M times (where M is an integer of 1 or more) of a write step causing a threshold voltage of the memory cell to undergo transition to a desired value in stages,
executes the write step of an identical stage in order of the first page, the second page, . . . , the N-th page in each of the blocks, and
adopts an n1+M-th page as the reference page.

18. The nonvolatile semiconductor memory device according to claim 16, wherein
the control unit
executes on each of the memory cells M times (where M is an integer of 1 or more) of a write step causing a threshold voltage of the memory cell to undergo transition to a desired value in stages,
executes the write step of an identical stage in order of the first page, the second page, . . . , the N-th page in each of the blocks, and
when a final data write before suspension of the data write is on an n2-th page (where n2 is an integer of 1 to n1) and is an m-th stage (where m is an integer of 1 to M) write step on the n2-th page, adopts an n2+m-th page as the reference page.

19. The nonvolatile semiconductor memory device according to claim 11, wherein
the control unit adopts as the reference page a page where the data write is last performed in the target block.

20. The nonvolatile semiconductor memory device according to claim 11, wherein
the control unit, when the data write is suspended having executed the data write on the first through N-th pages after the most recent data erase on the target block, omits the data read on the reference page.

* * * * *